United States Patent
Kim et al.

(10) Patent No.: US 7,022,628 B2
(45) Date of Patent: Apr. 4, 2006

(54) METHOD FOR FORMING QUANTUM DOTS USING METAL THIN FILM OR METAL POWDER

(75) Inventors: Young-Ho Kim, Seoul (KR); Yoon Chung, Seoul (KR); Hyoung-Jun Jeon, Seoul (KR); Hwan-Pil Park, Gwangju Metropolitan (KR); Chong-Seung Yoon, Seoul (KR)

(73) Assignee: Industry-University Cooperation Foundation, Hanyang University, Seoul (KR)

( * ) Notice: Subject to any disclaimer, the term of this patent is extended or adjusted under 35 U.S.C. 154(b) by 52 days.

(21) Appl. No.: 10/697,587

(22) Filed: Oct. 29, 2003

(65) Prior Publication Data

US 2004/0092125 A1    May 13, 2004

(30) Foreign Application Priority Data

Oct. 30, 2002 (KR) ............... 10-2002-0066592
Jul. 8, 2003   (KR) ............... 10-2003-0046036
Jul. 11, 2003  (KR) ............... 10-2003-0047196

(51) Int. Cl.
    *H01L 21/00*   (2006.01)
(52) U.S. Cl. .............. 438/962; 438/478; 438/764; 438/783; 257/14
(58) Field of Classification Search ........... 438/962, 438/585, 591, 783, 784, 478, 764, 500, 46; 257/14, 15, 16, 18
See application file for complete search history.

(56) References Cited

U.S. PATENT DOCUMENTS

| | | | | |
|---|---|---|---|---|
| 5,906,670 A | * | 5/1999 | Dobson et al. | ............... 257/17 |
| 6,306,736 B1 | * | 10/2001 | Alivisatos et al. | .......... 438/497 |
| 6,534,782 B1 | * | 3/2003 | Liang et al. | .................. 257/17 |
| 2002/0088970 A1 | * | 7/2002 | Yu et al. | ........................ 257/12 |
| 2003/0129311 A1 | * | 7/2003 | Huang | ........................ 427/337 |

OTHER PUBLICATIONS

Chung et al. "Synthesis of oxide nanoparticles embedded in polyimide". Paper presented to Hanyang University, Dept. of Materials Science and Engineering, Seoul, Korea.

* cited by examiner

*Primary Examiner*—Kevin M. Picardat
(74) *Attorney, Agent, or Firm*—Hamre, Schumann, Mueller & Larson, P.C.

(57) ABSTRACT

Disclosed herein is a method for forming quantum dots, comprising the steps of (a) depositing a metal thin layer onto a substrate, (b) coating a dielectric precursor onto the metal thin layer, and (c) stepwisely heating the resultant substrate; or a method for forming quantum dots, comprising the steps of (a) mixing a dielectric precursor diluted in a solvent and a metal powder and stirring the mixture, (b) coating the mixture onto a substrate, and (c) heating the resultant substrate. The method can easily control the size, density and uniformity of metal oxide quantum dots.

22 Claims, 8 Drawing Sheets

METHOD FOR FORMING QUANTUM DOTS USING METAL THIN FILM OR METAL POWDER

BACKGROUND OF THE INVENTION

1. Field of the Invention

The present invention relates to a method for forming quantum dots using a metal thin film or metal powder, and more particularly to a method for forming nanometer-sized metal oxide quantum dots which can easily control the size, density and uniformity of the oxide quantum dots.

2. Description of the Related Art

In general, materials having a particle size less than several tens of nanometers may exhibit new physical properties such as quantum effects. Quantum dots refer to physical subunits exhibiting these quantum effects.

Conventional methods for forming quantum dots have been achieved by one of the following various processes, for example: (i) a process including forming quantum dots on a selected substrate depending on the position of quantum dots to be formed, and growing the quantum dots thereon [e.g., InAs is grown on a GaAs substrate and InAs is grown on an InP substrate]; (ii) a process for forming quantum dots inside a substrate or insulating thin film; (iii) a process including forming quantum dots on selected regions of a substrate, and covering a multi-layer thin film thereon; (iv) a process for controlling the size and distribution of particles and minimizing the coalescence of the particles by using sputtering, vacuum evaporation deposition, chemical vapor deposition, or epitaxy technique. In addition, this process can solve a variety of problems generated during the procedure; (v) an inert gas condensation using thermal evaporation obtained after vaporizing a precursor; (vi) a vapor phase synthesis using microwave plasma or laser ablation; (vii) a process using a chemical vapor condensation technique for decomposing and synthesizing a metal-organic material in combustion flame or a hot-wall reactor; (viii) a process for producing metals/alloys and ceramic nanometer-sized powders as well as coated or doped nano-composite powders at atmospheric pressure or under low vacuum using an aerosol-spraying technique, or a process for producing a material containing a large amount of narrowly density-distributed nanoparticles by directly spraying onto a substrate; (ix) a chemical process for preventing the coalescence of fluorescent particles by granulating precursor particles using a nucleation technique and growing the precursor granules. This process is carried out by mixing an aqueous solution of fluorescent raw materials and an aqueous solution of a compound containing a luminescent metal in the presence of a solvent, precipitating particles from the mixture, heating the precipitated particles together with vapor phase fluorescent raw materials to produce fluorescent nanoparticles.

However, these conventional processes for forming quantum dots have problems that the distributed state of particles and the thickness of layers cannot be readily controlled and the processes undergo many complex steps, causing reduced throughput and considerable production cost.

In particular, according to the chemical approaches among these conventional methods, nanoparticles manufactured by injecting an aqueous solution or spray solution are condensed, sintered and annealed. At this time, bulky particles are formed. Accordingly, the chemical approaches require additional catalysts and additives to prevent the nanoparticles from coalescing. Moreover, the chemical approaches are disadvantageous in terms of low yield. Furthermore, when a powder is mixed with a polymer to produce a polymer containing nanoparticles, the powder must be previously manufactured to a nanometer size.

SUMMARY OF THE INVENTION

Therefore, the present invention has been made in view of the above problems, and the object of the present invention is to provide a method for forming nanometer-sized metal oxide quantum dots having a uniform size distribution and to provide quantum dots formed by the above method.

Another object of the present invention is to provide a method for forming size-controlled quantum dots by adjusting heating conditions, the amount of a solvent used and the thickness of an insulating layer.

Another object of the present invention is to provide a method for forming density-controlled quantum dots by adjusting the thickness of metal thin layers or amount of metal powder in order to produce a multi-layer thin film and adjusting the kind and amount of a solvent in order to previously react a metal and a precursor.

Another object of the present invention is to provide a method for forming quantum dots in a simple and economical manner without the use of an apparatus for forming a metal layer.

Another object of the present invention is to provide a method for forming quantum dots which can easily control the size, density and distribution by adjusting the kind and amount of a metal powder used or heating conditions.

Another object of the present invention is to provide a method for forming quantum dots in which a liquid state material is applied by spin coating, spraying, casting, jetting, dispensing, etc., thereby applying into intended shapes and applying onto flat regions, bent faces and specially selected regions of a substrate.

In accordance with one aspect of the present invention, there is provided a method for forming quantum dots, comprising the steps of: (a) depositing a metal thin layer onto a substrate; (b) coating an dielectric precursor onto the metal thin layer; and (c) stepwisely heating the resultant substrate on which the metal thin layer 2 and the dielectric precursor were sequentially stacked in a furnace.

In accordance with another aspect of the present invention, there is provided a method for forming quantum dots, comprising the steps of: (a) mixing a dielectric precursor diluted in a solvent and a metal powder, and stirring the mixture; (b) coating the mixture onto a substrate; and (c) stepwisely heating the resultant substrate.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, the present invention will be explained in more detail with reference to the accompanying drawings.

The present invention provides a method for forming quantum dots using a metal thin film, comprising the steps of: (a) depositing a metal thin layer 2 onto a substrate 1; (b) coating a dielectric precursor 3 onto the metal thin layer 2; and (c) heating the resultant substrate 1, on which the said metal thin layer and the said dielectric precursor were sequentially stacked, in a furnace in which the temperature is stepwisely elevated to a maximum of 200 to 500° C.

The present invention also provides a method for forming quantum dots using a metal powder, comprising the steps of: (a) mixing a dielectric precursor diluted in a solvent and a metal powder, and stirring the mixture; (b) coating the mixture onto a substrate; and (c) heating the resultant substrate with the temperature being stepwisely elevated to a maximum of 200 to 500° C.

The metal of the metal thin layer or the metal powder is at least one selected from the group consisting of copper, zinc, tin, cobalt, iron, cadmium, lead, magnesium, barium, molybdenum, indium, nickel, tungsten, bismuth, silver, manganese and alloys thereof.

The dielectric precursor is preferably an acidic precursor capable of dissolving the metal.

The acidic precursor preferably includes those containing carboxyl groups (—COOH).

The acidic dielectric precursor reacts with metal, and curing of acidic precursor forms the metal oxide nanoparticles in the polymer. The form of the metal may be thin film or powder.

Preferably, the method for forming quantum dots using a metal thin film according to the present invention further comprises the step of subjecting the resultant substrate 1 on which the metal thin layer 2 and the dielectric precursor 3 are sequentially accumulated to a first intermediate heating at 80–150° C., prior to step (c).

Preferably, the method for forming quantum dots using a metal thin film according to the present invention further comprises the step of depositing a solution, in which the dielectric precursor 3 is dissolved in a solvent, onto the substrate and subjecting the resultant substrate 1 to a second intermediate heating at 80–150° C., prior to step (a).

The solvent is preferably at least one selected from N-methylpyrrolidone (NMP), water, N-dimethylacetamide and diglyme.

Preferably, the method for forming quantum dots using a metal powder according to the present invention further comprises the additional step of stirring the mixture so that the metal powder is sufficiently reacted with the dielectric precursor after step (a).

Preferably, the method for forming quantum dots using a metal powder according to the present invention further comprises the step of subjecting the resultant substrate, on which dielectric precursor solution in which the metal powder has been dissolved was coated, to a first intermediate heating at 80–150° C., prior to step (c).

Preferably, the method for forming quantum dots using a metal powder according to the present invention further comprises the step of depositing a solution, in which the dielectric precursor 3 is dissolved in a solvent, onto the substrate, subjecting the resultant substrate to a second intermediate heating at 80–150° C., prior to step (a).

The solvent is preferably at least one selected from N-methylpyrrolidone (NMP), water, N-dimethylacetamide and diglyme.

In the present invention, one technique selected from spin coating, jetting, spraying, printing, brushing, casting, blade coating, dispensing and molding is employed to coat the dielectric precursor in which the metal powder is dissolved onto the substrate.

In accordance with the method for forming quantum dots using a metal powder, the control of the size, density and distribution of quantum dots is carried out by adjusting the amount of the metal powder in the mixing step (a) and/or controlling the heating conditions in the heating step (c).

The present invention also provides a polymer thin film in which the metal oxide quantum dots formed by the method described above are dispersed.

The present invention also provides an electronic device including the polymer thin film in which metal oxide quantum dots are dispersed.

Hereinafter, the method for forming quantum dots using a metal thin film or metal powder according to the present invention will be explained in more detail in terms of the respective steps.

1. Method for Forming Quantum Dots Using Metal Thin Film

A First Step: Preparation of Substrate (1) Preparation of Substrate

A substrate is ultrasonically cleaned with TCE (trichloroethylene), acetone and methanol for 5 minutes, respectively, to remove impurities remaining on the substrate 1 so that an insulating film can be coated onto the substrate.

(2) A Second Intermediate Heating

Before carrying out the following second step, a solution of a dielectric precursor in a solvent is coated onto the substrate 1, followed by a second intermediate heating in an oven at 80–150° C. The second intermediate heating as a selective step of the present invention further improves the uniformity and density of quantum dots 4 to be formed.

The solvent may vary depending on the kind of the dielectric precursor used, but is preferably at least one selected from N-methylpyrrolidone (NMP), water, N-dimethylacetamide and diglyme.

Figure 6:
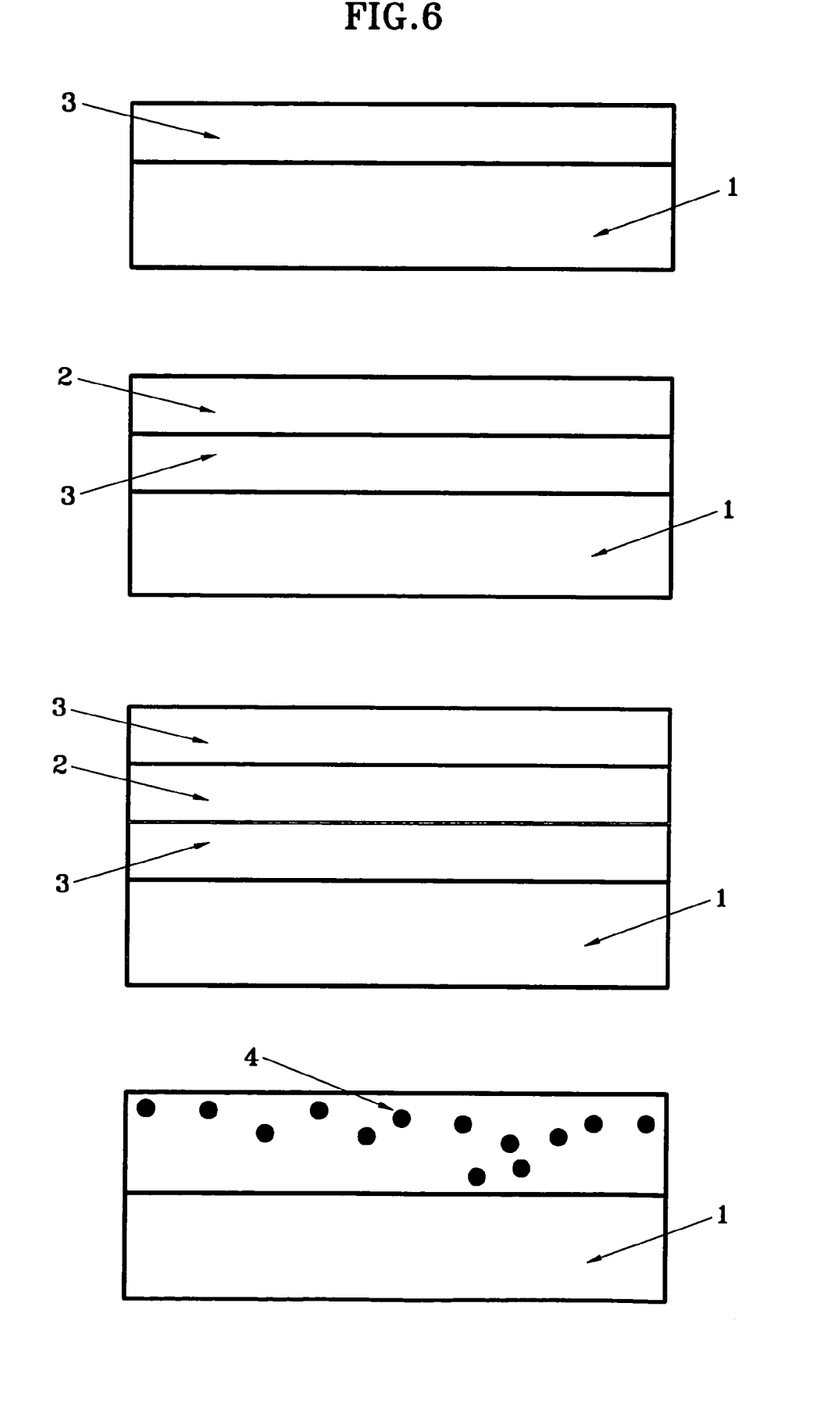
FIG. 6 is cross-sectional views schematically showing the respective steps of another embodiment of the method for forming quantum dots using a metal thin film according to the present invention.

When the second intermediate heating step is carried out in the method for forming quantum dots using a metal thin film, a multi-layer thin film is produced as shown in FIG. 6.

A Second Step: Deposition of Metal Thin Layer

A metal thin layer 2 which can react with the dielectric precursor 3 is deposited onto the substrate 1 by a physical vapor deposition or chemical vapor deposition technique.

The thickness of the metal thin layer 2 may vary depending on the density of quantum dots to be formed and the reactivity between the metal thin layer 2 and the precursor 3, but preferably is 50 nm or less.

Examples of the metal usable to form the metal thin layer 2 in the present invention include, but are not limited to, pure metals, for example, copper, zinc, tin, cobalt, iron, cadmium, lead, magnesium, barium, molybdenum, indium, nickel, tungsten, bismuth, silver, manganese and alloys thereof.

Figure 1A:
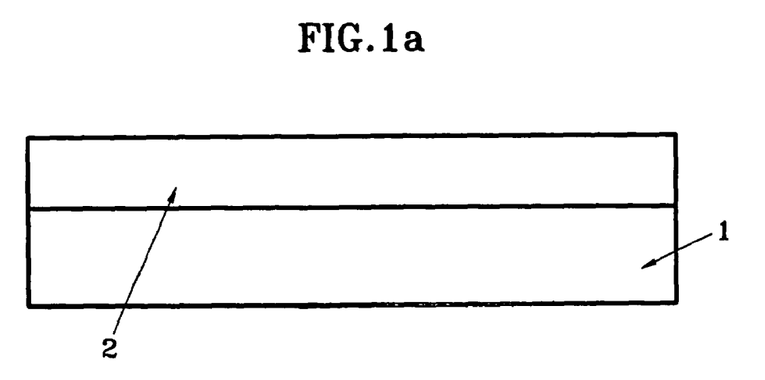
FIGS. 1a to 1c are cross-sectional views schematically showing the respective steps of a method for forming quantum dots using a metal thin film according to the present invention.

FIG. 1a shows a cross-sectional view schematically showing the state in which the metal thin layer 2 is deposited onto the substrate 1.

A Third Step: Coating of Dielectric Precursor

The thin layer of dielectric precursor 3 is formed on the metal thin layer 2 by a spin coating technique.

The dielectric precursor 3 can react with copper, zinc, tin, cobalt, iron, cadmium, lead, magnesium, barium, molybdenum, indium, nickel, tungsten, bismuth, silver, manganese or an alloy thereof, to precipitate metal oxide particles.

The dielectric precursor usable in the present invention is an acidic dielectric precursor, preferably, containing carboxyl groups (—COOH).

The dielectric precursor 3 can react with the metal thin layer 2 to precipitate metal oxide particles.

Figure 1B:
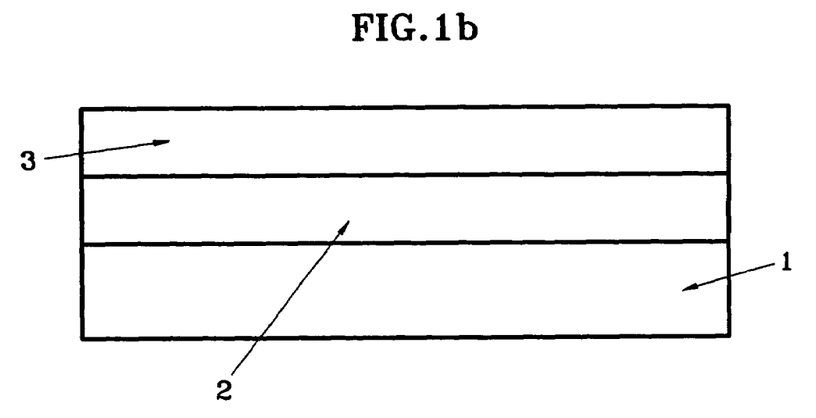

FIG. 1b shows a cross-sectional view schematically showing the state in which the dielectric precursor 3 is coated onto the metal thin layer 2.

A Fourth Step: Intermediate Heating

The resultant substrate 1 on which the metal thin layer 2 and the dielectric precursor 3 are sequentially stacked, is subjected to intermediate heating at 80–150° C. The intermediate heating evaporates the solvent remaining on the substrate 1 and thus increases the viscosity of the precursor 3. Such an increase in the viscosity reduces ion mobility without any change in the shape and thickness of the precursor.

A Fifth Step: Heating

The resultant substrate 1 heat-treated in the fourth step is subjected to heating in a furnace in which the temperature is stepwisely elevated to a maximum of 200 to 500° C., preferably 250 to 400° C. under nitrogen atmosphere. The maximum heating temperature is adjusted appropriately within this range depending on the type of the metal and the dielectric precursor. The heating time also is appropriately adjusted depending on the kind of the metal powder and the dielectric precursor, but is not especially limited.

Figure 1C:
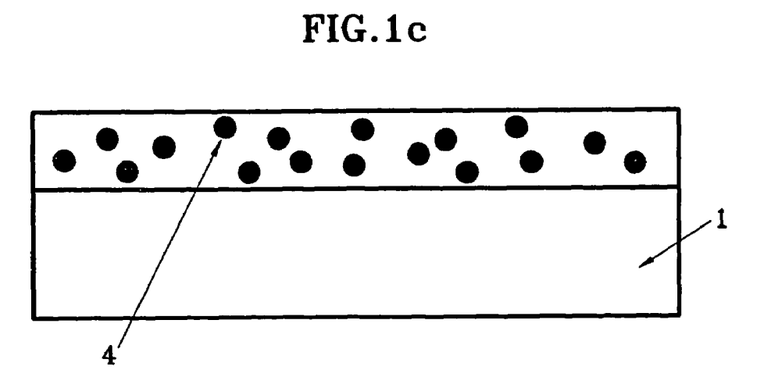

FIG. 1c shows a cross-sectional view schematically showing the state in which quantum dots 4 are formed on the substrate after heating.

2. Method for Forming Quantum Dots Using Metal Powder

A First Step: Preparation of Substrate (1) Preparation of Substrate

A substrate is prepared in the same manner as described in the method for forming quantum dots using a metal thin film.

(2) A Second Intermediate Heating

A second intermediate heating is carried out in the same manner as described in the method for forming quantum dots using a metal thin film.

A Second Step: Mixing of Metal Powder and Dielectric Precursor

A metal powder is mixed with a dielectric precursor diluted in a solvent. At this time, the metal powder can react with the dielectric precursor. The mixture is then stirred so that the metal powder and the dielectric precursor can sufficiently react with each other. The mixture may be subjected to the additional step of stirring so that the metal powder is sufficiently reacted with the dielectric precursor.

The stirring temperature and time are adjusted appropriately depending on the kind of the metal powder and the dielectric precursor, but are not especially limited. The metal powder and the dielectric precursor are preferably stirred at room temperature for 5 minutes–24 hours.

Examples of the metal constituting the metal powder usable in the present invention include, but are not limited to, pure metals, for example, copper, zinc, tin, cobalt, iron, cadmium, lead, magnesium, barium, molybdenum, indium, nickel, tungsten, bismuth, silver, manganese and alloys thereof.

The particle size of the metal powder may vary depending on the reactivity between the metal powder and the precursor, but preferably is 1 μm or less.

The amount of the metal powder mixed with the precursor is not limited to a specific range. Since the dielectric precursor reacts with the metal to form a metal oxide, the amount of the metal powder can be adjusted to control the density of metal oxide quantum dots to be formed. For example, when the metal powder is used in larger amount, the metal oxide quantum dots have higher density.

The dielectric precursor, which reacted with the metal powder, can be coated on the metal thin film surface to increase the density of metal oxide quantum dots.

The dielectric precursor usable in the present invention can react with the metal to precipitate metal oxide particles. Specifically, the dielectric precursor is an acidic dielectric precursor, preferably, containing carboxyl groups (—COOH).

The solvent usable in the present invention may vary depending on the kind of the dielectric precursor used, but is preferably at least one selected from N-methylpyrrolidone (NMP), water, N-dimethylacetamide and diglyme.

A Third Step: Coating the Solution of the Metal Powder Dissolved in Dielectric Precursor onto Substrate A solution of the metal powder dissolved in the dielectric precursor is coated onto the substrate. In the present invention, the solution of the metal powder dissolved in the precursor can be applied by any one of spin coating, jetting, spraying, printing, brushing, casting, blade coating, dispensing and molding techniques. In addition, the said solution can be applied onto flat surfaces and bent faces of the substrate. In particular, the use of jetting or dispensing technique enables formation of quantum dots on selected regions of the substrate.

Figure 7A:
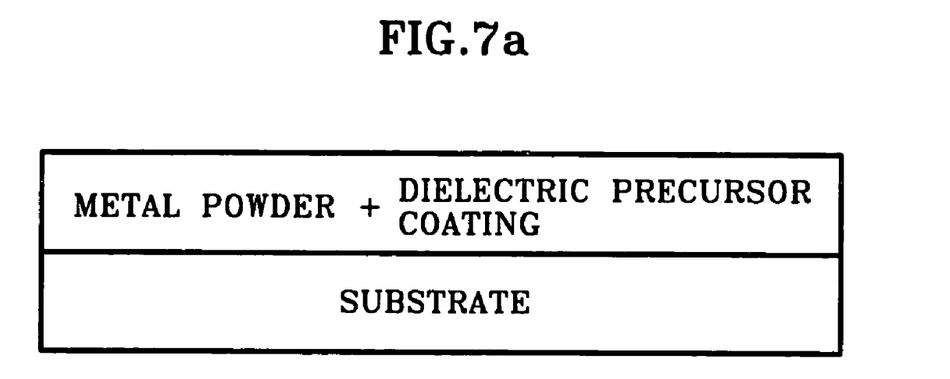
FIG. 7a is a cross-sectional view schematically showing the state in which a metal powder dissolved in a dielectric precursor is deposited on the substrate in accordance with a method for forming quantum dots using a metal powder according to the present invention.

FIG. 7a shows a cross-sectional view schematically showing the state in which the solution of the metal powder dissolved in the dielectric precursor is coated onto the substrate.

A Fourth Process: Intermediate Heating

The resultant substrate onto which the solution of the metal powder dissolved in the precursor is coated, is subjected to intermediate heating at 80–150° C. The intermediate heating evaporates the solvent remaining on the substrate and thus increases the viscosity of the mixture. Such an increase in the viscosity reduces ion mobility in the mixture.

A Fifth Step: Heating

The resultant substrate 1 heat-treated in the fourth step is subjected to heating in a furnace in which the temperature is stepwisely elevated to a maximum of 200 to 500° C., preferably 250 to 400° C. under nitrogen atmosphere. The maximum heating temperature is appropriately adjusted within this range depending on the kind of the metal and the dielectric precursor. The heating time also is appropriately adjusted depending on the kind of the metal powder and the dielectric precursor.

As the heating temperature is increased, the reaction between the metal and the precursor is vigorous and thus the metal oxide is formed rapidly. In addition, ion mobility increased and the metal oxide particles diffused rapidly at high heating temperature. Accordingly, by varying the maximum heating temperature, time required for maintaining the heating, time required for reaching the maximum heating temperature and the presence of the intermediate heating step, ion mobility and the diffusion of metal oxide particles are controlled and thus the size and distribution of quantum dots can be easily controlled.

Figure 7B:
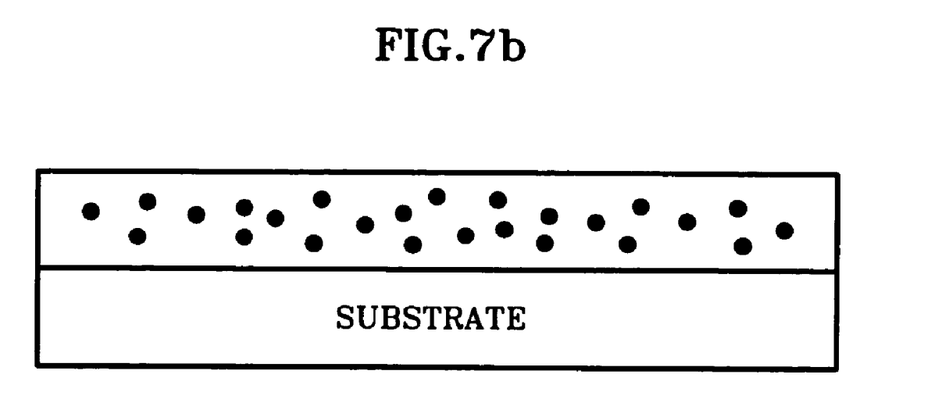
FIG. 7b is a cross-sectional view schematically showing the state in which quantum dots are formed on a substrate after heating, in accordance with a method for forming quantum dots using a metal powder according to the present invention.

FIG. 7b shows a cross-sectional view schematically showing the state in which quantum dots are formed on the substrate after heating.

EXAMPLE

Example 1

Formation of Quantum Dots Using Copper Thin Film

A substrate was ultrasonically cleaned with trichloroethylene, acetone and methanol for 5 minutes, respectively, and copper was deposited onto the substrate by a physical vapor deposition technique.

Figure 2:
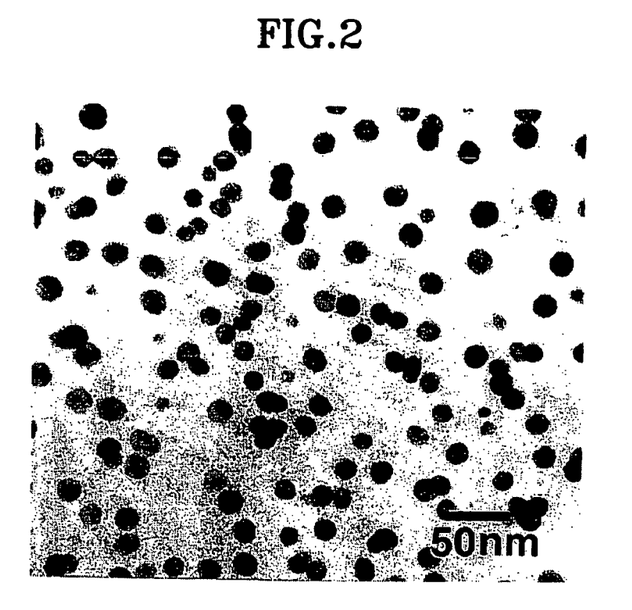
FIG. 2 is a transmission electron microscopy (TEM) image showing copper oxide quantum dots formed in accordance with an embodiment of a method for forming quantum dots using a metal thin film according to the present invention.

BPDA-PDA (biphenyltetracarboxylic dianhydride-p-phenylenediamine) as a polyamic acid was thinly formed on the copper thin layer by a spin coating technique. The resultant substrate was subjected to intermediate heating at 100° C. for 30 minutes. The substrate was then stepwisely heated to a maximum temperature of 400° C. for 1 hour. After heating, the substrate was cooled at room temperature to form copper oxide quantum dots. A transmission electron microscopy (TEM) image of the copper oxide quantum dots is shown in FIG. 2. As can be seen from FIG. 2, the copper oxide quantum dots have a size of 10 nm or less and are uniformly distributed.

Example 2

Formation of Quantum Dots Using Zinc Thin Film

Figure 3:
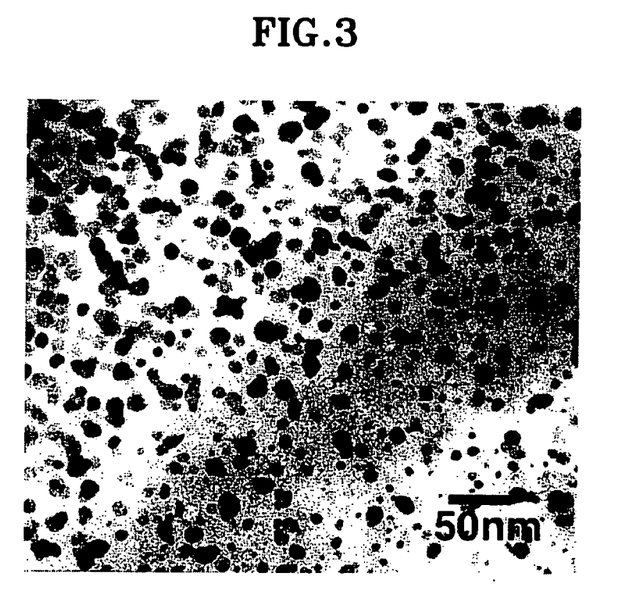
FIG. 3 is a transmission electron microscopy image showing zinc oxide quantum dots formed in accordance with an embodiment of a method for forming quantum dots using a metal thin film according to the present invention.

Zinc oxide quantum dots were formed in the same manner as in Example 1, except that zinc was used instead of copper. A transmission electron microscopy (TEM) image of the zinc oxide quantum dots is shown in FIG. 3. As can be seen from FIG. 3, the zinc oxide quantum dots have a size of 10 nm or less and are uniformly distributed.

Example 3

Formation of Quantum Dots Using Iron Thin Film

Figure 4:
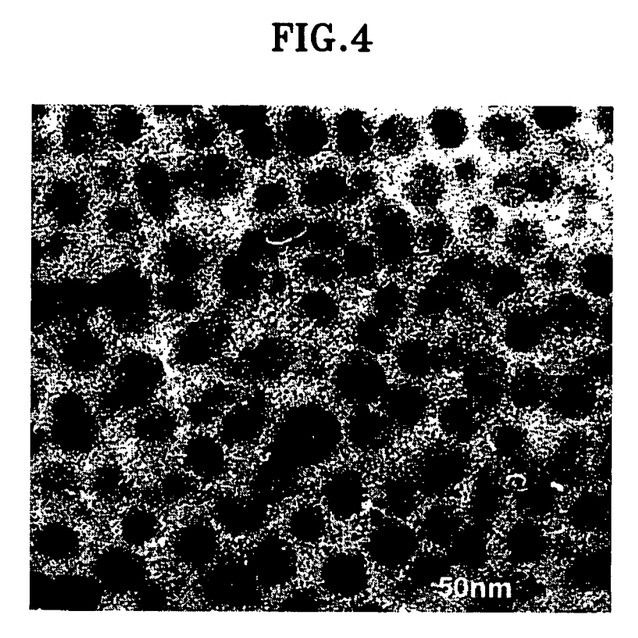
FIG. 4 is a transmission electron microscopy image showing iron oxide quantum dots formed in accordance with an embodiment of a method for forming quantum dots using a metal thin film according to the present invention.

Iron oxide quantum dots were formed in the same manner as in Example 1, except that iron was used instead of copper. A transmission electron microscopy (TEM) image of the iron oxide quantum dots is shown in FIG. 4. As can be seen from FIG. 4, the Iron oxide quantum dots have a size of 10 nm or less and are uniformly distributed.

Example 4

Formation of Quantum Dots Using Tin Thin Film

Figure 5:
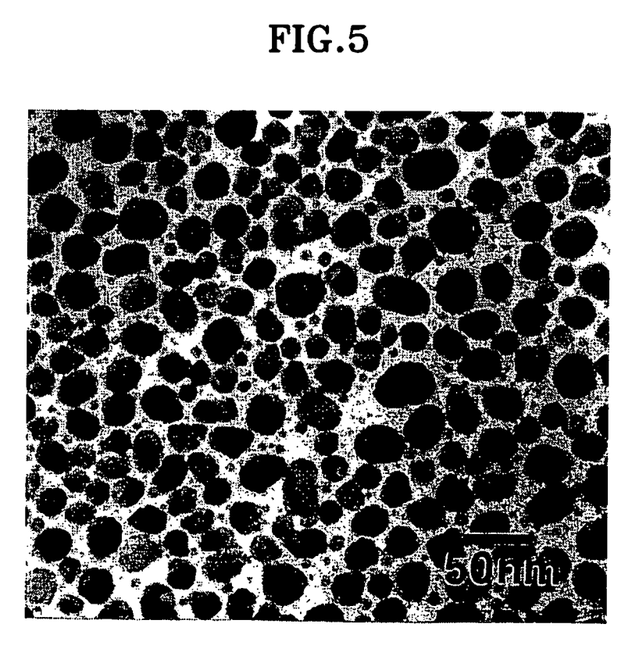
FIG. 5 is a transmission electron microscopy image showing tin oxide quantum dots formed in accordance with an embodiment of a method for forming quantum dots using a metal thin film according to the present invention.

Tin oxide quantum dots were formed in the same manner as in Example 1, except that tin was used instead of copper. A transmission electron microscopy (TEM) image of the tin oxide quantum dots is shown in FIG. 5. As can be seen from FIG. 5, the tin oxide quantum dots have a size of 20 nm or less and are uniformly distributed.

Example 5

Production of Multi-Layer Thin Film Using Metal Thin Film

Another embodiment of the method for forming quantum dots according to the present invention is explained below with reference to FIG. 6.

In order to control the density of metal oxide quantum dots 4 formed in the above examples, a solution of polyamic acid in NMP as a solvent was coated onto the substrate 1 using a spin coating technique, followed by a second intermediate heating in an oven at 80–150° C. After the second intermediate heating, the second to fifth steps described above were carried out to form quantum dots 4. The quantum dots 4 thus formed have improved uniformity and constant density.

FIG. 6 is cross-sectional views schematically showing the respective steps for producing the multi-layer thin film, in accordance with the embodiment of the method for forming quantum dots according to the present invention.

Example 6

Formation of Quantum Dots Using Copper Powder

Figure 8:
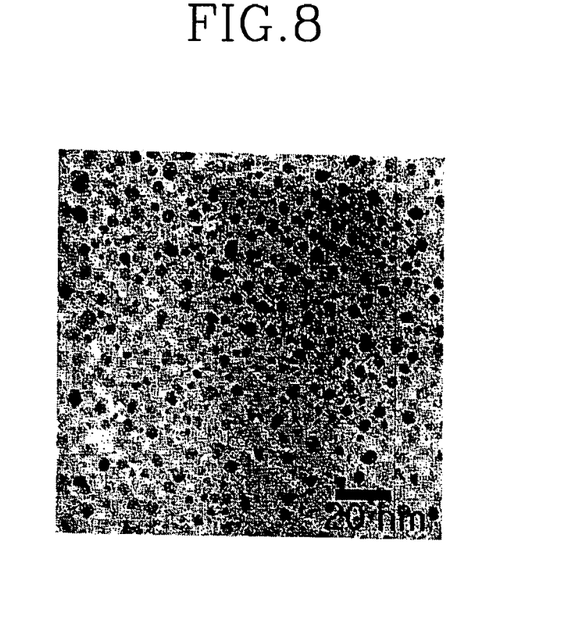
FIG. 8 is a transmission electron microscopy (TEM) image showing copper oxide quantum dots formed in accordance with an embodiment of a method for forming quantum dots using a metal powder according to the present invention.

A copper powder having an average particle size of 4 μm was mixed with BPDA-PDA (biphenyltetracarboxylic dianhydride-p-phenylenediamine) as a dielectric precursor diluted in NMP, and then stirred. The mixture was left at room temperature for 24 hours to allow for sufficient reaction. The thin layer of the mixture was coated onto a substrate, which was in advance ultrasonically cleaned with trichloroethylene, acetone and methanol for 5 minutes, respectively, by a spin coating technique. The resultant substrate was subjected to intermediate heating at 100° C. for 30 minutes. The substrate was then stepwisely heated to a maximum temperature of 400° C. for 1 hour. After heating, the substrate was cooled at room temperature to form copper oxide quantum dots. A transmission electron microscopy (TEM) image of the copper oxide quantum dots is shown in FIG. 8. As can be seen from FIG. 8, the copper oxide quantum dots have a size of 10 nm or less and are uniformly distributed.

Example 7

Formation of Quantum Dots Using Iron Powder

Figure 9:
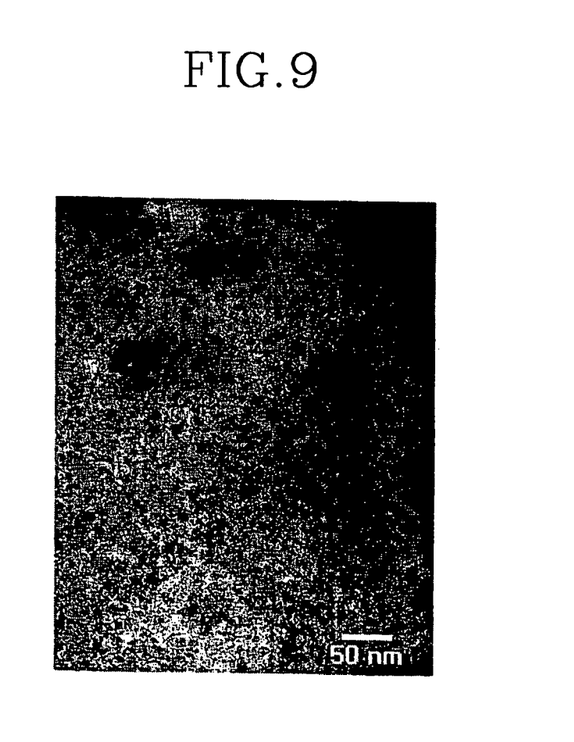
FIG. 9 is a transmission electron microscopy (TEM) image showing iron oxide quantum dots formed in accordance with an embodiment of a method for forming quantum dots using a metal powder according to the present invention.

Iron oxide quantum dots were formed in the same manner as in Example 6, except that iron powder was used instead of copper powder. A transmission electron microscopy (TEM) image of the iron oxide quantum dots is shown in FIG. 9.

Example 8

Formation of Quantum Dots Using Manganese Powder

Figure 10:
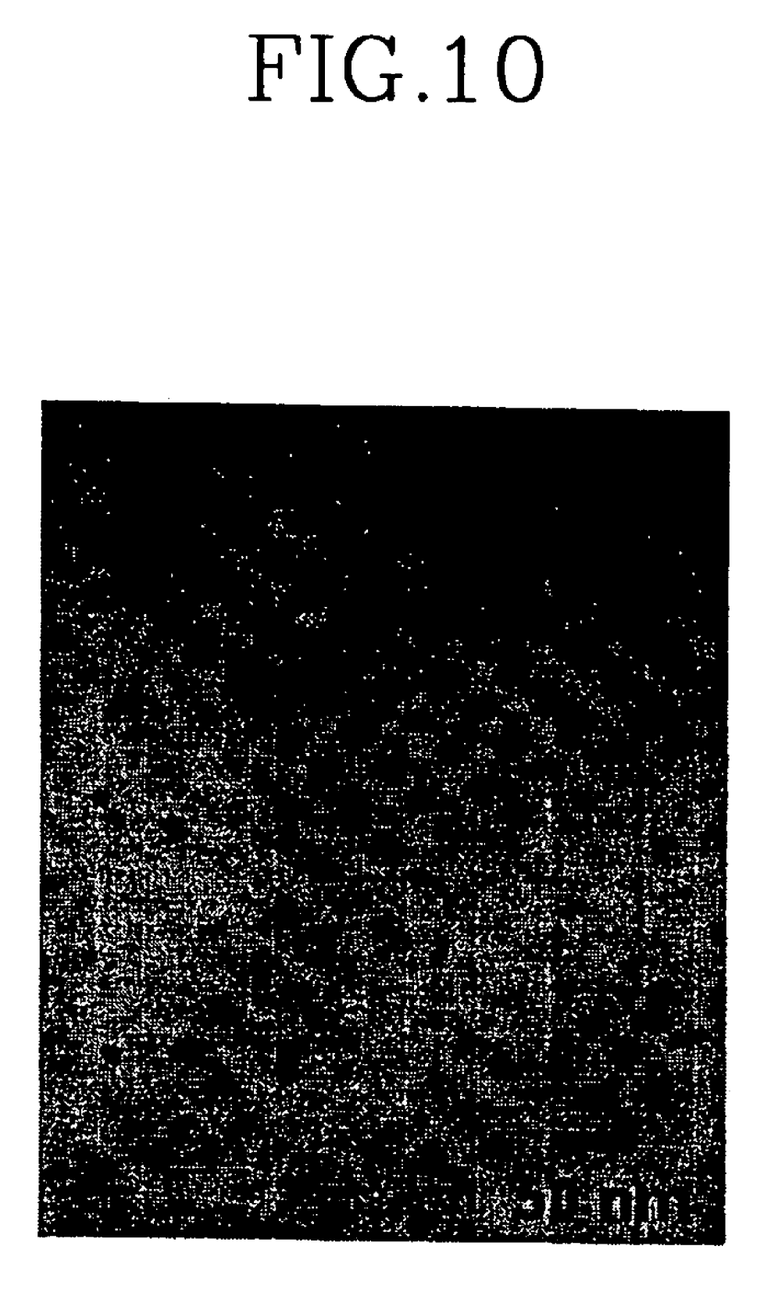
FIG. 10 is a transmission electron microscopy (TEM) image showing manganese oxide quantum dots formed in accordance with an embodiment of a method for forming quantum dots using a metal powder according to the present invention.

Manganese oxide quantum dots were formed in the same manner as in Example 6, except that manganese powder was used instead of copper powder. A transmission electron microscopy (TEM) image of the manganese oxide quantum dots is shown in FIG. 10.

Example 9

Control of Size and Density of Quantum Dots by Changing Heating Conditions

Figure 11A:
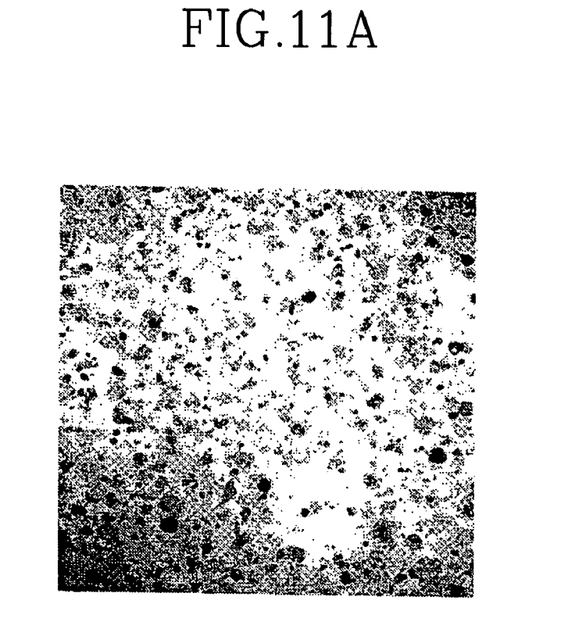
FIG. 11a is a transmission electron microscopy (TEM) image showing copper oxide quantum dots formed after heating at 40° C. for 1 hour, in accordance with a method for forming quantum dots using a metal powder of the present invention.
Figure 11B:
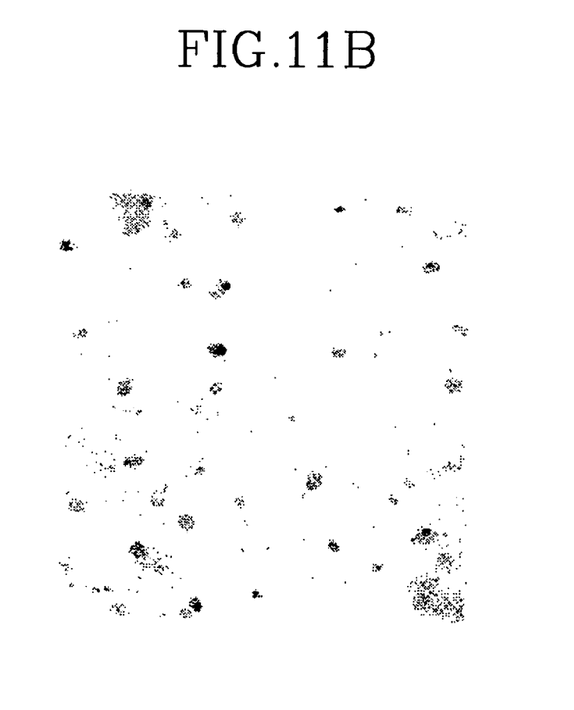
FIG. 11b is a transmission electron microscopy (TEM) image showing copper oxide quantum dots formed after heating at 300° C. for 2 hours, in accordance with a method for forming quantum dots using a metal powder of the present invention.

Copper oxide quantum dots were formed in the same manner as in Example 6, except that the heating conditions were changed. FIG. 11a is a transmission electron microscopy (TEM) image showing copper oxide quantum dots formed after heating at 40° C. for 1 hour, and FIG. 11b is a transmission electron microscopy (TEM) image showing copper oxide quantum dots formed after heating at 300° C. for 2 hours. The density of the copper oxide quantum dots shown in FIG. 11a was higher than that of the copper oxide quantum dots shown in FIG. 11b. This confirms that it is possible to control the size and density of quantum dots by adjusting the heating conditions for fabricating the metal oxide quantum dots.

The metal oxide particles formed by the method of the present invention exhibit the semiconductor characteristics shown in Table 1 below.

Accordingly, dielectrics in which nanometer-sized semiconductor quantum dots are dispersed can be applied to optical and optoelectronic devices and the like. Further, the results obtained from the present invention are expected to be utilized in the fabrication of ultrahigh-speed optical signal processing devices, next generation optical modulators, photodetectors, integrated optical waveguide devices, high-efficiency information and communications components and the like. In particular, when an iron powder is used to form iron oxide quantum dots, $\gamma$-$Fe_2O_3$ is formed and thus iron oxide quantum dots containing $\gamma$-$Fe_2O_3$ can be applied to magnetic components, e.g., magnetic media.

As apparent from the above description, the method according to the present invention can easily control the size, density and uniformity of metal oxide quantum dots.

In addition, since the metal oxide quantum dots are formed by simple coating and deposition processes and exhibit semiconductor characteristics, they can be used for the fabrication of electronic devices having a large area and multi-layer structure.

Furthermore, according to the method of the present invention, the metal oxide quantum dots can be formed on desired regions of a substrate by previously coating a dielectric precursor onto a patterned metal thin layer.

In accordance with the present invention, the method for forming quantum dots using a metal powder is carried out in a simple and economical manner, easily controls the size, density and distribution by adjusting the kind and amount of the metal powder or heating conditions, and facilitates the formation of ultra-fine and uniform quantum dots. In addition, since a liquid state material is applied by various coating techniques, it can be applied onto flat surfaces, bent faces and specially selected regions of a substrate. The metal oxides formed by the method of the present invention exhibit the semiconductor characteristics, quantum dots using the metal oxides can be applied to semiconductors.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming quantum dots, comprising the steps of;
   (a) depositing a metal thin layer onto a substrate;
   (b) coating a dielectric precursor onto the metal thin layer; and
   (c) heating the resultant substrate, on which said metal thin layer and said dielectric precursor were sequentially stacked, in a furnace in which the temperature is stepwisely elevated to a maximum of 200 to 500° C.

2. A method for forming quantum dots, comprising the steps of:
   (a) mixing a dielectric precursor diluted in a solvent and a metal powder, and stirring the mixture;
   (b) coating the dielectric precursor solution in which said metal powder was dissolved, onto a substrate; and

TABLE 1

|  | $Cu_2O$ | ZnO | $Fe_2O_3$ | $SnO_2$ | CdO | CoO | $Bi_2O_3$ | NiO | $In_2O_3$ |
|---|---|---|---|---|---|---|---|---|---|
| Band gap (eV) | 2.1 | 3.2 | 3.1 | 3.54 | 2.1 | 4.0 | 2.8 | 4.2 | 3.9 |

(c) heating the resultant substrate with the temperature being stepwise elevated to a maximum of 200 to 500° C.

3. The method for forming quantum dots according to claim 1, wherein the metal of said metal thin layer is at least one selected from the group consisting of copper, zinc, tin, cobalt, iron, cadmium, lead, magnesium, barium, molybdenum, indium, nickel, tungsten, bismuth, silver, manganese and alloys thereof.

4. The method for forming quantum dots according to claim 1, wherein said dielectric precursor is an acidic precursor capable of dissolving said metal.

5. The method for forming quantum dots according to claim 4, wherein said acidic precursor includes those containing carboxyl groups (—COOH).

6. The method for forming quantum dots according to claim 1, further comprising the step of subjecting the resultant substrate on which the metal thin layer and the dielectric precursor were sequentially stacked, to a first intermediate heating at 80–150° C., prior to step (c).

7. The method for forming quantum dots according to claim 1, further comprising the step of depositing a solution in which the dielectric precursor is dissolved in a solvent, onto the substrate and subjecting the resultant substrate to a second intermediate heating at 80–150° C., prior to step (a).

8. The method for forming quantum dots according to claim 2, wherein the said solvent is at least one selected from N-methylpyrrolidone (NMP), water, N-dimethylacetamide and diglyme.

9. The method for forming quantum dots according to claim 2, further comprising the additional step of stirring the mixture so that the metal powder is sufficiently reacted with the dielectric precursor after step (a).

10. The method for forming quantum dots according to claim 2, further comprising the step of subjecting the resultant substrate onto which the dielectric precursor solution in which the metal powder has been dissolved was coated, to a first intermediate heating at 80–150° C., prior to step (c).

11. The method for forming quantum dots according to claim 2, further comprising the step of depositing a solution in which the dielectric precursor is dissolved in a solvent, onto the substrate and subjecting the resultant substrate to a second intermediate heating at 80–150° C., prior to step (a).

12. The method for forming quantum dots according to claim 11, wherein the solvent is at least one selected from N-methylpyrrolidone (NMP), water, N-dimethylacetamide and diglyme.

13. The method for forming quantum dots according to claim 2, wherein the coating of the solution of the dielectric precursor in which the metal powder is dissolved, onto the substrate is carried our by one technique selected from spin coating, jetting, spraying, printing, brushing, casting, blade coating, dispensing and molding.

14. The method for forming quantum dots according to claim 2, wherein the control of the size, density and distribution of quantum dots is carried out by adjusting the amount of the metal powder in the mixing step (a) and/or controlling the heating conditions in the heating step (c).

15. A polymer thin film in which the quantum dots formed by the method according to claim 1 are metal oxide quantum dots and are dispersed.

16. An electronic device including the polymer thin film according to claim 15 in which metal oxide quantum dots are dispersed.

17. The method for forming quantum dots according to claim 2, wherein the metal of said metal powder is at least one selected from the group consisting of copper, zinc, tin, cobalt, iron cadmium, lead, magnesium, barium, molybdenum, indium, nickel, tungsten, bismuth, silver, manganese, and alloys thereof.

18. The method for forming quantum dots according to claim 2, wherein said dielectric precursor is an acidic precursor capable of dissolving said metal.

19. A polymer thin film in which the quantum dots formed by the method according to claim 2 are metal oxide quantum dots and are dispersed.

20. A polymer thin film according to claim 15, wherein the metal oxide quantum dots may be dispersed with uniform size and distribution.

21. An electronic device according to claim 16, wherein the polymer thin film includes metal oxide quantum dots that may be dispersed with uniform size and distribution.

22. A polymer thin film according to claim 19, wherein the metal oxide quantum dots may be dispersed with uniform size and distribution.

* * * * *